US008828799B2

(12) United States Patent
Rhyner et al.

(10) Patent No.: US 8,828,799 B2
(45) Date of Patent: Sep. 9, 2014

(54) METHOD OF FORMING AN INTEGRATED CIRCUIT PACKAGE INCLUDING A DIRECT CONNECT PAD, A BLIND VIA, AND A BOND PAD ELECTRICALLY COUPLED TO THE DIRECT CONNECT PAD

(71) Applicant: Texas Instruments Incorporated, Dallas, TX (US)

(72) Inventors: Kenneth Robert Rhyner, Rockwall, TX (US); Peter R. Harper, Morgan Hill, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/939,804

(22) Filed: Jul. 11, 2013

(65) Prior Publication Data

US 2013/0295722 A1    Nov. 7, 2013

Related U.S. Application Data

(62) Division of application No. 13/191,783, filed on Jul. 27, 2011, now Pat. No. 8,598,048.

(51) Int. Cl.
H01L 21/60 (2006.01)
H01L 23/00 (2006.01)
H01L 23/48 (2006.01)

(52) U.S. Cl.
CPC ............... *H01L 24/03* (2013.01); *H01L 23/48* (2013.01)

USPC .......... 438/108; 257/737; 257/738; 257/773; 257/774; 257/778; 257/786; 257/E21.511

(58) Field of Classification Search
USPC .................... 257/666–795, E23.067, E23.07, 257/E21.506, E21.511; 438/106–127
See application file for complete search history.

(56) References Cited

U.S. PATENT DOCUMENTS

| | | | | |
|---|---|---|---|---|
| 5,399,898 A * | 3/1995 | Rostoker | ....................... | 257/499 |
| 5,615,477 A * | 4/1997 | Sweitzer | ....................... | 29/840 |
| 5,663,598 A * | 9/1997 | Lake et al. | ....................... | 257/737 |
| 5,817,540 A * | 10/1998 | Wark | ....................... | 438/107 |
| 6,473,308 B2 * | 10/2002 | Forthun | ....................... | 361/749 |
| 6,884,653 B2 * | 4/2005 | Larson | ....................... | 438/107 |
| 7,462,939 B2 * | 12/2008 | Sundstrom | ....................... | 257/778 |
| 2009/0115072 A1* | 5/2009 | Rhyner et al. | ....................... | 257/778 |
| 2009/0140419 A1* | 6/2009 | Rhyner et al. | ....................... | 257/737 |
| 2009/0289362 A1* | 11/2009 | Rhyner et al. | ....................... | 257/738 |

* cited by examiner

*Primary Examiner* — Steven J Fulk
*Assistant Examiner* — Eric Ward
(74) *Attorney, Agent, or Firm* — Steven A. Shaw; Frederick J. Telecky, Jr.

(57) ABSTRACT

A method for forming an integrated circuit package is disclosed. A flex circuit is form by forming a direct connect pad on a first side of a dielectric layer. After forming the direct connect pad, an opening from a second side of the dielectric layer is formed to expose the direct connect pad. A blind via is formed within the opening in the dielectric layer. A first conductor is formed within the opening. A bond pad of a semiconductor die is electrically coupled with the direct connect pad using a second conductor, wherein the bond pad and the second conductor directly overlie the direct connect pad.

2 Claims, 5 Drawing Sheets

METHOD OF FORMING AN INTEGRATED CIRCUIT PACKAGE INCLUDING A DIRECT CONNECT PAD, A BLIND VIA, AND A BOND PAD ELECTRICALLY COUPLED TO THE DIRECT CONNECT PAD

CROSS-REFERENCE WITH RELATED APPLICATIONS

This Application is a Divisional of and claims priority to U.S. patent application Ser. No. 13/191,783, filed Jul. 27, 2011, now U.S. Pat. No. 8,598,048 issued on Dec. 3, 2013. Said Application is incorporated herein by reference.

FIELD

The present teachings relate to the field of semiconductor device manufacture, and more particularly to methods and structures for transferring a signal or voltage between a semiconductor die and a receiving substrate onto which the semiconductor die is mounted through conductive structures on a flexible circuit.

BACKGROUND

Miniaturization of semiconductor device packages and electronic components is an ongoing goal for design engineers. Reducing a package perimeter or "footprint" results in the increased availability of space on a receiving substrate to which the package is mounted, such as a printed circuit board (PCB). Additionally, the increased availability of space can also allow a decrease in the footprint of the receiving substrate itself, and thus the size of the electronic component.

Other design goals include increasing the speed of an electronic component and decreasing electronic interference of the operating device. Device speed can be improved by decreasing the length of electrical interconnects within a device, which can also result in a decrease in electronic interference.

Flip chip mounting of a semiconductor die or chip onto a receiving substrate has been widely used because a flip chip device can include very short electrical connections between a plurality of bond pads at a perimeter of a semiconductor die and a plurality of landing pads on the receiving substrate. The electrical connections can include a solder bump on each bond pad which is physically contacted with a landing pad on the receiving substrate. After physical contact is established, the solder can be reflowed to electrically couple the plurality of bond pads with the plurality of landing pads. Because the electrical connections are short, the signal delay and cross-signal interference can be small.

Flexible circuits (i.e., flex circuits) including tape automated bond "TAB" circuits can be interposed between one or more semiconductor chips and a receiving substrate to provide a way to reroute electrical connections between the semiconductor chips and the receiving substrate. In one type of device, semiconductor die is mounted in flip chip fashion onto a first side of a flex circuit. A bond pad at a perimeter of the semiconductor die is electrically connected to a first die bonding pad on the first side of the flex circuit, for example using solder. A first end of a conductive active trace on the first surface of the flex circuit is electrically connected to the first die bonding pad and routed across the first surface of the flex circuit to a laterally located via which comprises a single conductive structure which extends vertically through the thickness of the flex circuit to the opposite, second side of the flex circuit. A conductor such as a solder ball is attached to the via on the second side of the flex circuit, and the solder ball can then connect to a landing pad on the receiving substrate, which electrically couples the semiconductor die with the receiving substrate.

SUMMARY OF THE EMBODIMENTS

In contemplating conventional interconnections using a flex circuit, the inventors have realized that a flex circuit typically includes many parallel active traces which can be a source of trace-to-trace coupling and capacitance. Further, the length of the traces can contribute to increased trace inductance and resistance. In some circuits, these problems can result in an unreliable device with excessive signal propagation delays, latchup problems, and capacitance issues.

The inventors have thus designed a flex circuit which has a reduced number of structures for some of the electrical interconnections. In these interconnections, a trace is not required, but can still be used at other locations on the flex circuit. Reducing the number of required traces can reduce the incidence of trace-to-trace coupling and capacitance, and trace inductance.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present exemplary embodiment of the present teachings, an example of which is illustrated in the accompanying drawings. Wherever possible, the same reference numbers will be used throughout the drawings to refer to the same or like parts.

An embodiment of the present teachings can reduce the number of active traces required on a flex circuit. Traces, particularly parallel traces, can interfere with each other during operation of the device and result in trace-to-trace interference such as coupling and capacitance. Further, a flex circuit active trace and flex circuit via pad can have a high inductance. Reducing the number of active traces can reduce trace-to-trace interference and inductance.

Figure 1:
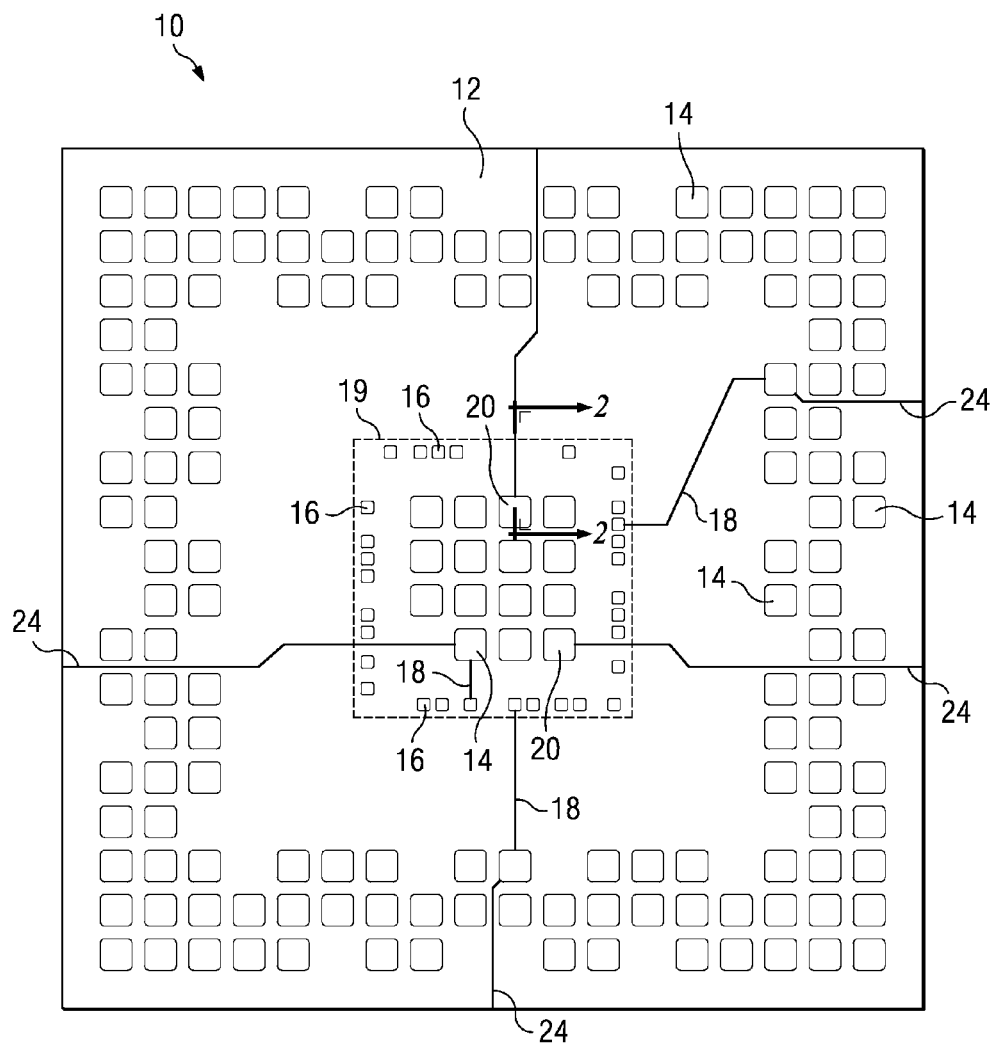
FIG. 1 is a plan view (top view) of a flex circuit according to an embodiment of the present teachings.

An embodiment in accordance with the present teachings is depicted in FIGS. 1-9. FIG. 1 is a plan view (top view) of a portion of a flex circuit 10, including a dielectric layer 12, for example a polymer sheet. The flex circuit 10 of FIG. 1 further includes a patterned conductive layer which can form a plurality of flex circuit via pads 14, a plurality of die bonding pads 16, and a plurality of active traces 18 which can electrically couple a flex circuit via pad 14 with one of the die bonding pads 16. The flex circuit via pads 14 can be processed to include other conductive layers such that a signal can be passed from the top side of the flex circuit 10 through a thickness of the flex circuit 10, to the bottom side of the flex circuit 10. The die bonding pads 16 are formed on the top surface of the flex circuit 10 and do not overlie a via which extends into the thickness of the flex circuit 10. A semiconductor die (50, in FIG. 5) will be attached to the structure of FIG. 1 and can have a perimeter 19. The patterned conductive layer which forms flex circuit via pads 14, die bonding pads 16, and active traces 18 can be formed using any conventional patterned metal process, such as an etching process, a laser ablation process, direct metal deposition using a vapor deposition process, etc.

The FIG. 1 structure further includes at least one "direct connect" pad 20 which has a portion disposed on the dielectric layer 12. For purposes of the present teachings, a "direct connect" pad 20 is a particular design of flex circuit via pad 14 which is not connected to a die bonding pad 16 or to a flex circuit via pad 14 through the use of an active trace 18, and is within a perimeter of the die (50, FIG. 5) which will be attached to the flex circuit 10. A direct connect pad 20 can be electrically connected to a first end of a plating trace 24 as depicted, but a second end of the plating trace 24 is not connected to another pad. Further, each flex circuit via pad 14, die bonding pad 16, and active trace 18 can be electrically connected to a plating trace 24 as depicted. The plurality of direct connect pads 20 are within the perimeter 19. A first plurality of via pads 14 can also be within the perimeter 19 of the die, and a second plurality of via pads 14 can be outside the perimeter 19 of the die. As stated above, each via pad 14 is electrically coupled to an active trace 18, while the direct connect pads 10 are not connected to an active trace.

Active traces 18, as known in the art, are conductive features which run along the surface of the flex circuit 10 for an extended distance. Active traces 18 are typically used to electrically couple two or more features together, such as a flex circuit via pad 14 and a die bonding pad 16, during operation of the device. Plating traces 24, as known in the art, are used to electrically connect every flex circuit via pad 14, die bonding pad 16, active trace 18, and other conductive features to an electroplating apparatus during a metal plating process during fabrication of the flex circuit, and can run to an edge at the perimeter of the dielectric layer 12 as depicted. For simplicity of depiction, only a few plating traces 24 have been depicted in FIG. 1. Copper pads and traces, if left unplated, can become corroded during the lifetime of the device. To reduce or prevent this corrosion, the copper can be plated with a more stable metal such as gold to form a gold foil. A plating trace 24 can be used to electrically connect a direct connect pad 20 during the plating process, but the plating trace 24 is not used to connect the direct connect pad 20 to another conductive structure after plating is complete. That is, the plating trace 24 is not electrically active during operation of the device and, therefore, is not an active trace. In contrast, an active trace 18 is electrically active during operation of the device, as it electrically couples two or more other conductive features together, for example to transfer a signal, voltage, or ground between the two or more other conductive features.

Figure 2:
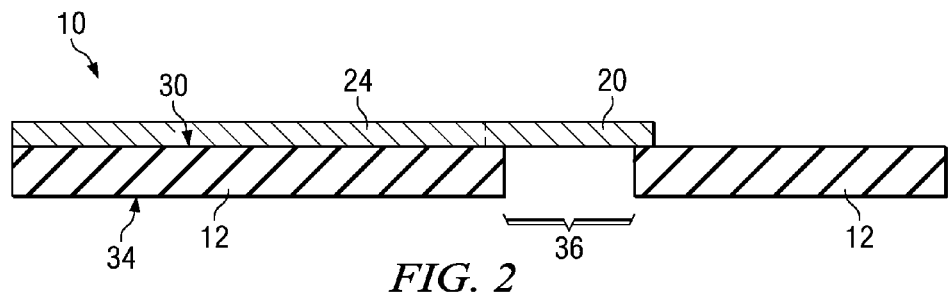
FIG. 2 is a magnified cross section along 2-2 of FIG. 1.

FIG. 2 is a magnified cross section of a direct connect pad 20 the FIG. 1 device along 2-2 of FIG. 1, and includes a direct connect pad 20, a plating trace 24, and the flex circuit dielectric layer 12. The dielectric layer 12 can include a first surface 30 and a second surface 34 opposite the first surface 30, with the direct connect pad 20 being formed on the first surface 34. After forming the direct connect pad 20 and plating trace 24, a laser can be used to ablate an opening 36 in the dielectric layer 12 to expose the direct connect pad 20 from the second side 34 of the dielectric layer, which results in the FIG. 2 structure. The opening 36 can be circular, oval, square, rectangular, etc.

Figure 3:
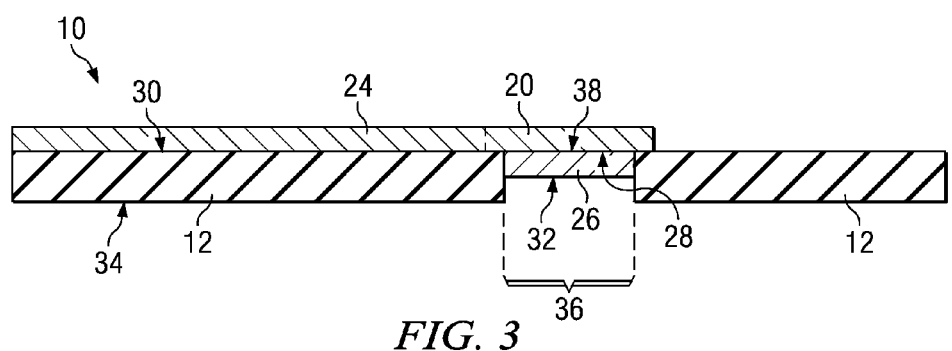
FIG. 3 is cross section of the FIG. 2 structure after forming a blind via on a direct connect pad.

After forming the FIG. 2 structure, a metal plating process can be performed to form a via 26 within the opening 36 and on the direct connect pad 20, specifically on a first surface 28 of the direct connect pad 20 as depicted in FIG. 3. In this embodiment, a first surface 38 of the of the via 26 which contacts the first surface 28 of the contact pad 20 is generally coplanar with the first surface 30 of the dielectric layer 12, and a second surface 32 of the via 26 can be located about half way into a thickness of the dielectric layer 12. The via 26 can be formed using a plating process which plates the via 26 onto the first surface 28 of the direct connect pad 20 to self-align the via 26 to the opening 36 within the dielectric layer 12. The via 26 of the FIG. 3 structure is referred to herein as a "blind via." For purposes of this disclosure, a blind via includes a first conductor (via 26) formed within an opening 36 within a dielectric layer 12, wherein the first conductor 26 is formed on a second conductor 20, wherein the second conductor 20 is formed on a first surface 30 of the dielectric layer 12. The first side 28 of the second conductor (direct connect pad 20) is exposed during the formation of the opening 36 prior to forming the first conductor 26. The opening 36 is provided from a second side 34 of the dielectric 12 to expose the second conductor 20 formed on the first side 30 of the dielectric 12, wherein the second conductor 20 is formed prior to providing the opening 36.

Figure 4:
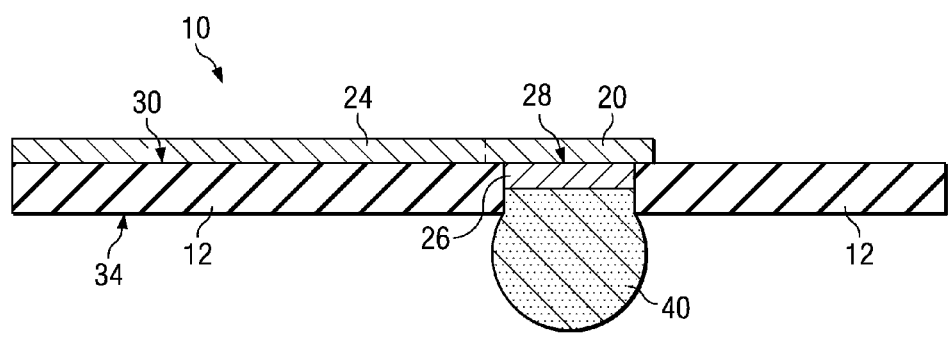
FIG. 4 is a cross section of the FIG. 3 structure after forming a conductor on the blind via.

Subsequently, a conductor 40 such as a solder ball is disposed within the opening 36 to fill the opening 36, which electrically couples the conductor 40 to the second surface 32 of the blind via 26 as depicted in FIG. 4. It will be understood that other layers such as adhesion layers and layers to enhance conduction between the direct contact pad 20 and the conductor 40 may be present but are not depicted for simplicity of explanation.

Figure 5:
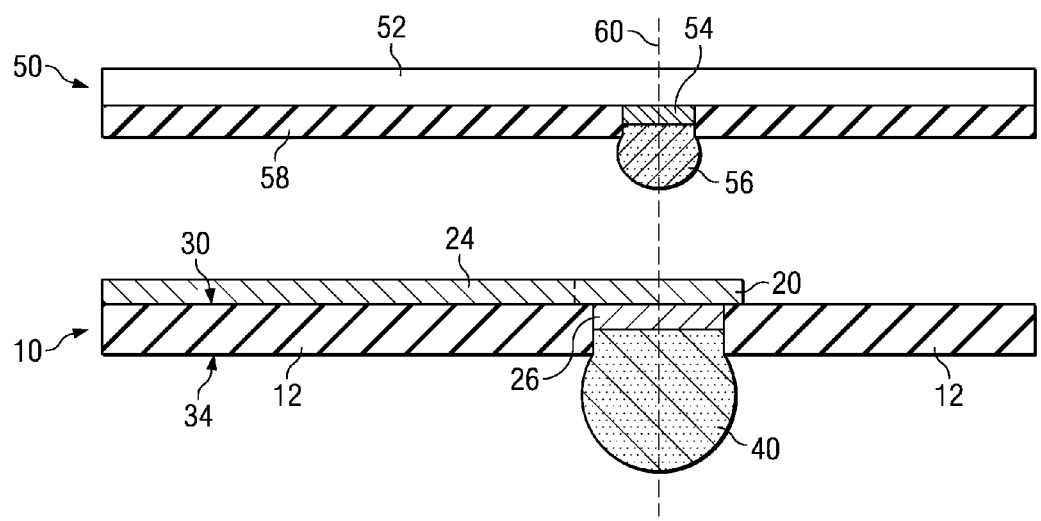
FIG. 5 is a cross section depicting alignment of the FIG. 4 structure with a bond pad of a semiconductor die and a conductor on the bond pad.

A semiconductor die 50 as depicted in FIG. 5 can include a semiconductor substrate 52 such as a silicon substrate, a bond pad 54 on a surface of the semiconductor substrate 52, and a conductor 56 such as a solder ball which can be part of a ball grid array (BGA). The conductor 56, which is electrically coupled with the bond pad 54, is aligned with the flex circuit 10 as depicted. The semiconductor die 50 may include other layers such as a passivation layer 58 and conductive circuit layers such as metal and/or doped features (not individually depicted for simplicity of explanation). As represented by line 60, each of the bond pad 54, the conductor 56 on the bond pad 54, the flex circuit direct connect pad 20, the blind via 26, and the conductor 40 are vertically aligned, each with the other. Alignment of each of these features in the vertical direction provides a direct horizontally overlapping region of each of these features with each of the other features aligned therewith. In other words, at least a portion of each directly vertically aligned feature overlaps at least a portion of every other directly vertically aligned feature in the horizontal direction, such that at least a portion of the bond pad 54 directly overlies conductor 56, at least a portion of conductor 56 directly overlies direct connect pad 20, at least a portion of direct connect pad 20 directly overlies blind via 26, and at least a portion of blind via 26 directly overlies conductor 40.

Figure 6:
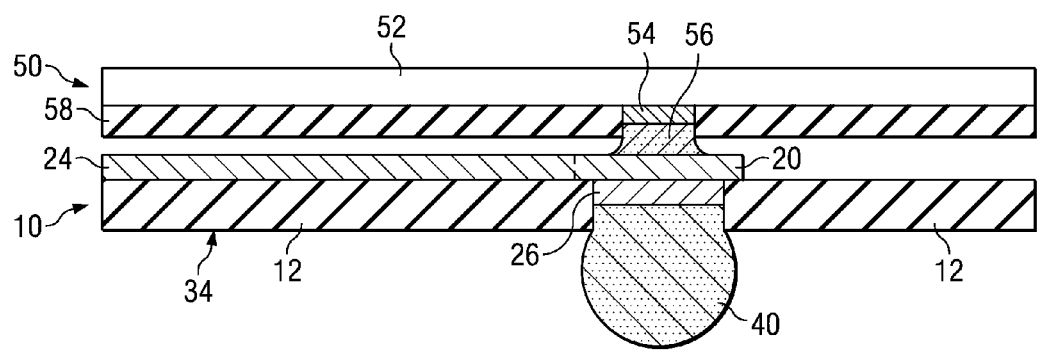
FIG. 6 is a cross section of the FIG. 5 structure after a reflow process to electrically couple the bond pad of the semiconductor die with the flex circuit direct connect pad.

Next, the conductor 56 on the bond pad 54 can be physically contacted with the direct connect pad 20 and reflowed to result in the FIG. 6 structure. The reflow process can include a controlled collapse chip connection (i.e., "C4") process as known in the art. It will be appreciated that FIG. 6 depicts only a portion of the semiconductor die 50 and flex circuit 10, and that electrical connections between other bond pads 54 and direct connect pads 20 can be made. Additionally, several different semiconductor chips 50 can be connected to a single flex circuit 10.

Figure 7:
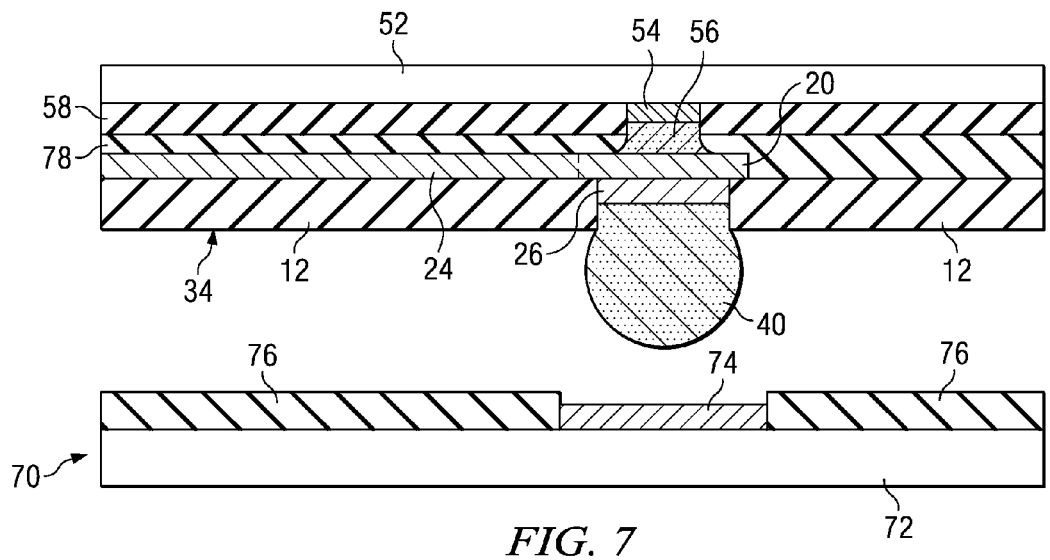
FIG. 7 is a cross section depicting alignment of a conductor on the flex circuit blind via with a receiving substrate landing pad.

After connecting one or more semiconductor chips 50 to the flex circuit 10, the flex circuit 10 can be electrically connected to a receiving substrate 70 such as a printed circuit board (PCB), ceramic substrate, another semiconductor die, or semiconductor wafer as depicted in FIG. 7. The receiving substrate 70 can include a support layer 72, a landing pad 74. It will be understood that the receiving substrate can further include conductive circuit layers and electronic components such as microprocessors, memory, etc. which are not individually depicted for simplicity of explanation, as well as a passivation layer 76. FIG. 7 further depicts a dielectric underflow 78 between the semiconductor die 50 and the flex circuit 10 which functions as an adhesive to physically connect the die 50 to the flex circuit 10. As depicted in FIG. 7, the conductor 40 which is electrically coupled with the direct connect pad 20 through the blind via 26 is aligned with the landing pad 74 of the receiving substrate 70, and physically contacted therewith.

Figure 8:
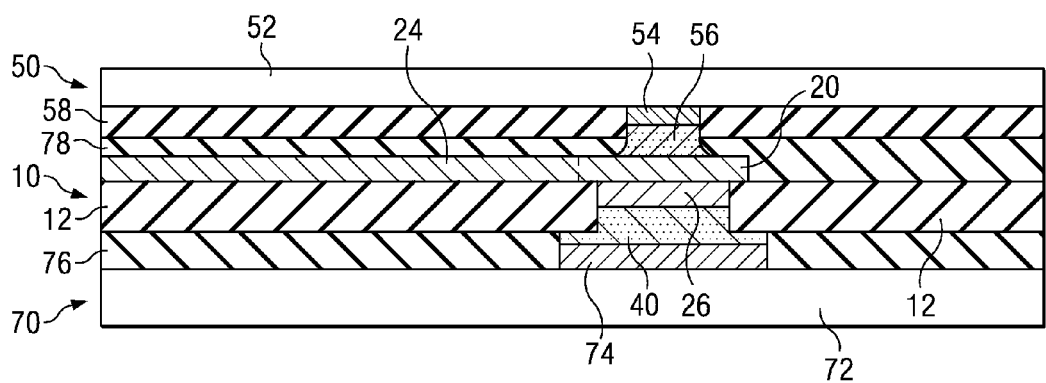
FIG. 8 is a cross section of the FIG. 7 structure after a reflow process to electrically couple the blind via and direct connect pad with the landing pad of the receiving substrate which also electrically couples the bond pad with the receiving substrate landing pad.

Next, the conductor 40 is reflowed to electrically couple the blind via 26 with the landing pad 74 as depicted in FIG. 8. It will be appreciated that the completed structure of FIG. 8 can include other layers such as standoff layers, circuit layers, dielectric layers, solder masks, electronic components, adhesive layers, etc., which have not been depicted for simplicity of explanation.

Thus the structure of FIG. 8 includes an integrated circuit package including a semiconductor bond pad 54 electrically coupled with a landing pad 74 of a receiving substrate 70. The electrical coupling depicted includes a first conductor 56 such as solder which electrically couples the semiconductor bond pad 54 with a direct connect pad 20 of the flex circuit 10, a blind via 26 electrically connected with the direct connect pad 20, and a second conductor 40 which electrically couples the blind via 26 to the landing pad 74 of the receiving substrate 70. This structure has a short length (i.e., height, as depicted in FIG. 8) compared to the active traces 18 depicted in FIG. 1, and can transfer a signal between the semiconductor bond pad 54 and the landing pad 74 over a shorter time period than an active trace 18. Additionally, electrical interference between adjacent connections of FIG. 8 is expected to have small connection-to-connection coupling and capacitance, and a small inductance. Further, the resistance of the FIG. 8 connection is expected to be less than the resistance of an active trace.

In an embodiment, a semiconductor die 50 can have semiconductor bond pads 54 at the perimeter of the semiconductor die 50 which are electrically connected with die bonding pads 16. The die bonding pads 16 can be routed to other via pads 14 of the flex circuit 10, and then to other landing pads 74 of a receiving substrate 70, using active traces 18 as depicted in FIG. 1. A completed device can further include a plurality of connections as depicted in FIG. 8, specifically a plurality of bond pads 54 which are designed to be located directly over direct connect pads 20 of a flex circuit 10 and directly over landing pads 74 of a receiving substrate 70.

Figure 9:
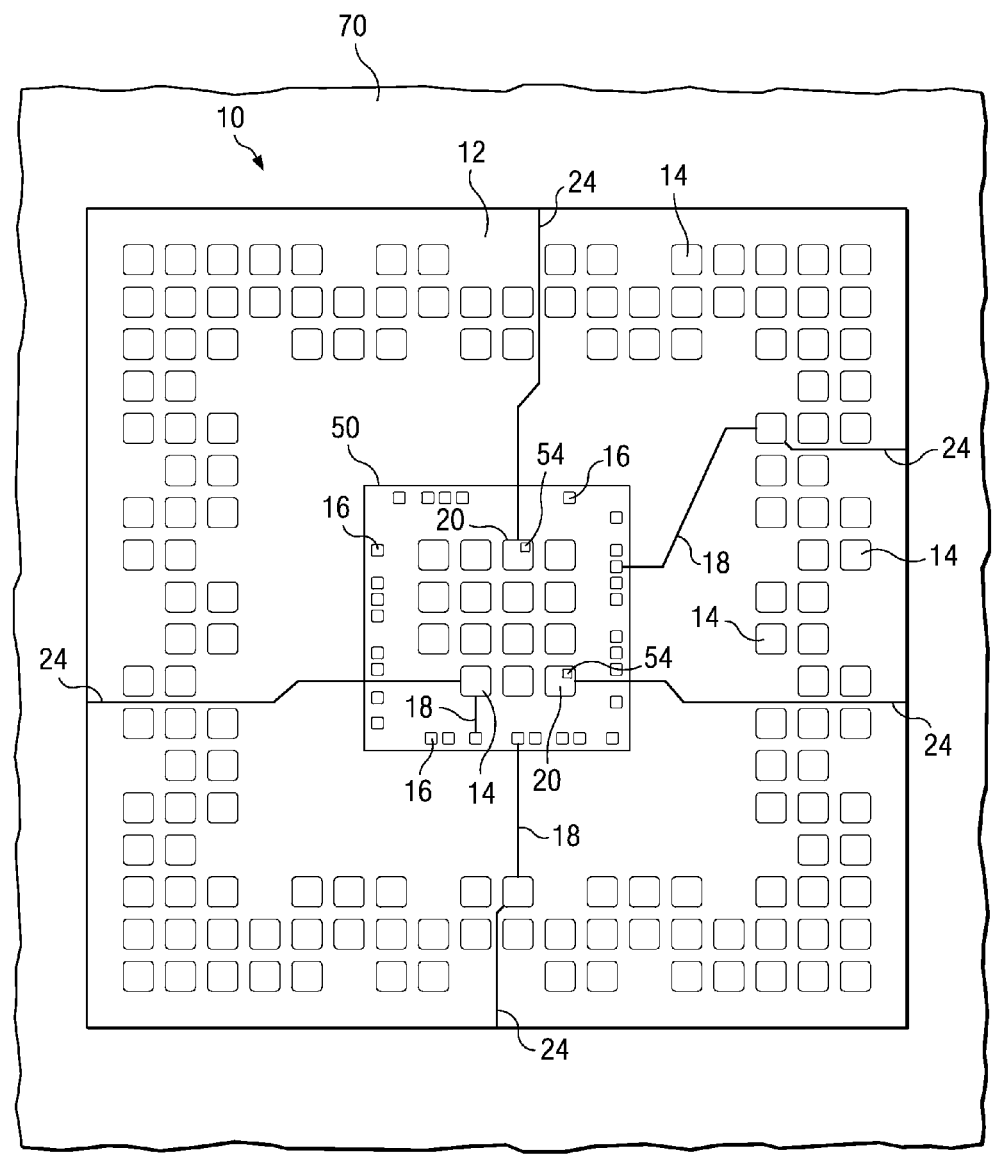
FIG. 9 is a plan view of the FIG. 8 structure after completing the blind vias and direct connect pads, and after attaching a semiconductor die.

FIG. 9 depicts an embodiment of a completed device, including a flip-chip mounted semiconductor die 50, the flex circuit 10, and the receiving substrate 70 as described above and depicted in FIG. 8. It will be understood that the depicted structures within the perimeter of the die 50 would not be visible, as they would be covered by the semiconductor die 50. In this embodiment, some semiconductor bond pads 54 align vertically, and directly overlie, direct connect pads 20. Flex circuit via pads 14 within the perimeter of the die 50 (and outside the perimeter of the die 50) do not have directly overlying semiconductor bond pads 54. Additionally, other semiconductor bond pads 54 on the semiconductor die 50 can directly overlie die bonding pads 16. The die bonding pads 16 can electrically couple with other flex circuit via pads 14, either inside or outside the perimeter of the die 50, for example using active traces 18 as depicted in FIG. 9. For simplicity of depiction, bond pads 54 along the periphery of semiconductor die 50 which directly overlie bonding pads 16 are not numbered on FIG. 9, for example because they have generally the same outline and perimeter as die bonding pads 16, and vertically align therewith. As stated above, die bonding pads 16 do not overlie a via which extends into the thickness of flex circuit 10, but lie on the first surface 30 of the flex circuit 10. In this embodiment, the semiconductor bond pads 54, conductor 56, direct connect pads 20, blind vias 26, conductor 40, and landing pads 74 of the receiving substrate 70 all align vertically and have at least a portion of each structure which overlaps with at least a portion of every other of the structures 54, 56, 20, 26, 40, and 74 in the horizontal direction as depicted in FIG. 8. The receiving substrate 70 can receive a plurality of flex circuit 10/semiconductor die 50 assemblies, as well as other types of semiconductor devices and electronic components.

As depicted in FIG. 9, one embodiment of the present teachings can include a first plurality bond pads 54 which are along the periphery of the semiconductor die 50 which are connected to smaller pads (i.e., die bonding pads 16, which each have a first surface area) on the flex circuit 10. The die bonding pads 16 do not overlie a via which extends into a thickness of the flex circuit 10, but instead lie on the surface of the flex circuit 10 in their entirety. The embodiment further includes a second plurality of bond pads 54 which are located toward the center of the overlying semiconductor die 50. The second plurality of bond pads 54 are electrically coupled to larger pads (i.e., direct connect pads 20, which have a second surface area which is larger than the first surface area as depicted) on the flex circuit 10. The direct connect pads 20 overlie a via (i.e., blind via 26) which extends into the thickness of the flex circuit 10. In addition, each via pad 14 has a surface area equal to the second surface area.

Because the via pads 14 and direct connect pads 20 can be processed simultaneously, the via pads 14 can also include a blind via 26 which extends into a thickness of the flex circuit dielectric 12, and a conductor 40 which is configured to be electrically connected to a landing pad 74 of a receiving substrate 70. However, the via pads 14 will be connected to an active trace 18 connected to another conductive feature. Further, via pads 14 will not be electrically coupled to a semiconductor die bond pad 54 which directly overlies the via pad 14. Generally, no bond pad 54 will directly overlie a via pad 14.

Various modifications can be made to the structure and method of the present teachings. For example, other conductors can be used instead of solder for conductors 40 and 56, such as conductive pastes, conductive powders, z-axis conductors, etc. Further, a plurality of semiconductor bond pads 54 can directly overlie a single direct connect pad 20. In this case, the plurality of semiconductor bond pads 54 which overlie a single direct connect pad 20 would become the same electrical point.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method for forming an integrated circuit package, comprising:
    forming a flex circuit using a method comprising:
        forming a dielectric layer having a first side and a second side opposite the first side;
        forming a plurality of die bonding pads on the first surface of the dielectric layer which do not overlie a via which extends into a thickness of the flex circuit dielectric layer each die bonding pad having a first surface area;
        forming a plurality of direct connect pads, each having a second surface area, on the first side of the dielectric layer each direct connect pad has a second surface area, wherein the second surface area is larger than the first surface area;
        forming a plurality of blind vias, wherein each blind via is electrically coupled to one direct connect pad of the plurality of direct connect pads;
        forming a plurality of conductors, wherein each conductor is electrically coupled to one blind via of the plurality of blind vias; and
        forming a plurality of via pads on the first surface of the dielectric layer, wherein each via pad has a surface area which is equal to the second surface area,
    each die bonding pad of the plurality of die bonding pads is electrically coupled to one of the via pads with an active trace,
    each one of the plurality of die bonding pads on the first surface of the dielectric layer positioned to couple with a bond pad from of a first plurality of bond pads on a semiconductor die,
    each one of the plurality of direct connect pads positioned to couple with a bond pad of a second plurality of bond pads, and
    each of the direct connect pads is free from contact with one of the plurality of die bonding pads.

2. The method of claim 1, further comprising flip chip mounting the semiconductor die to the flex circuit, wherein a bond pad on the die is electrically coupled to the direct connect pad.

* * * * *